(12) United States Patent
Hattori et al.

(10) Patent No.: US 7,674,357 B2
(45) Date of Patent: Mar. 9, 2010

(54) TRANSPARENT ELECTROCONDUCTIVE FILM AND PROCESS FOR PRODUCING SAME

(75) Inventors: Takeshi Hattori, Abiko (JP); Kunio Saegusa, Tsukuba-gun (JP); Yuzo Shigesato, Yokohama (JP)

(73) Assignee: Sumitomo Chemical Company, Limited, Osaka (JP)

( * ) Notice: Subject to any disclaimer, the term of this patent is extended or adjusted under 35 U.S.C. 154(b) by 548 days.

(21) Appl. No.: 10/876,525

(22) Filed: Jun. 28, 2004

(65) Prior Publication Data

US 2004/0238346 A1 Dec. 2, 2004

Related U.S. Application Data

(62) Division of application No. 10/103,120, filed on Mar. 22, 2002, now Pat. No. 6,773,636.

(30) Foreign Application Priority Data

Mar. 27, 2001 (JP) ............................... 2001-089621
Oct. 26, 2001 (JP) ............................... 2001-328894

(51) Int. Cl.
*C23C 14/34* (2006.01)
(52) U.S. Cl. ..................... 204/192.29; 204/192.26; 204/298.12; 204/298.13
(58) Field of Classification Search ............ 204/192.21, 204/192.26, 192.27, 192.28, 192.29, 298.12, 204/298.13
See application file for complete search history.

(56) References Cited

U.S. PATENT DOCUMENTS 3,388,053 A * 6/1968 Sinclair et al. ......... 204/192.21

3,749,658 A * 7/1973 Vossen, Jr. ............. 204/192.29
5,861,112 A 1/1999 Watanabe et al.
5,955,179 A 9/1999 Kickelhain et al.

FOREIGN PATENT DOCUMENTS

| EP | 0 654 447 A1 | | 5/1995 |
| JP | 03-106017 | * | 5/1991 |
| JP | 07-045127 A | | 2/1995 |
| JP | 08-124437 | * | 5/1996 |
| JP | 09-071419 | * | 3/1997 |
| JP | 9-71419 A | | 3/1997 |
| JP | 3198494 B2 | | 6/2001 |

OTHER PUBLICATIONS

Machine Translations of JP 09-071419 and JP 08-124437.*
Foreign translation of Keiji 09-071419 dated Mar. 1997.*
Foreign translation of Shigeta 03-106017 dated May 1991.*
Foreign translation of Tetsuo 08-124437 dated May 1996.*

* cited by examiner

*Primary Examiner*—Rodney G McDonald
(74) *Attorney, Agent, or Firm*—Sughrue Mion, PLLC

(57) ABSTRACT

There are provided:
(1) a process for producing an $InSbO_4$-containing transparent electroconductive film, which comprises the step of sputtering simultaneously:
  (i) a target (A) for sputtering, which comprises In, Sb and O, and whose atomic ratio of Sb/In is from 0.9 to 1.1, and
  (ii) a target (B) for sputtering, which comprises Sb,
(2) a transparent eletroconductive film, which contains In, Sb and O, and whose atomic ratio of Sb/In is from 0.8 to 1.5, and
(3) a target for sputtering, which contains In, Sb and O, and whose atomic ratio of Sb/In is from 1.2 to 2.0.

8 Claims, No Drawings

TRANSPARENT ELECTROCONDUCTIVE FILM AND PROCESS FOR PRODUCING SAME

This is a divisional of application Ser. No. 10/103,120 filed Mar. 22, 2002 now U.S. Pat. No. 6,773,636.

FIELD OF THE INVENTION

The present invention relates to a transparent electroconductive film and a process for producing the same.

BACKGROUND OF THE INVENTION

Transparent electroconductive films are used for applications such as electrodes for inorganic EL panels, liquid crystal displays and solar batteries; hot wave reflection films for window glass; and antistatic films. Among the transparent conductive films, an indium-tin oxide film comprising an indium oxide containing 2 to 20% by weight of tin oxide has many applications because of its high electroconductivity (that is, low electric resistivity) and superior translucency. The "indium-tin oxide" is hereinafter referred to as ITO.

However, the ITO has problems that (1) it is expensive, because it contains an expensive indium oxide in an amount of from 80 to 98% by weight, and (2) its transparency is not good, because it absorbs light ranging from visible rays having short wave lengths to ultraviolet rays.

In the production of inorganic EL panels, it is required to use a transparent electroconductive film, which does not decrease its electroconductivity even when heat-treated in air at a temperature exceeding 800° C. However, a transparent electroconductive film comprising the ITO, which is usually used for the production of inorganic EL panels, has a problem that it decreases its electroconductivity when heat-treated under such conditions.

As one of transparent electroconductive materials substitutable for the ITO, $InSbO_4$ is proposed. Said $InSbO_4$ has characteristics that (1) it is cheaper than the ITO, because a content of the expensive indium oxide is only a half of that of the ITO on a weight basis, and (2) its transparency is superior to the ITO, because it absorbs little light ranging from visible rays having short wave lengths to ultraviolet rays. However, an $InSbO_4$-containing transparent electroconductive film has never been obtained. For example, JP-A 9-71419 discloses a process for producing an $InSbO_4$-containing sintered object comprising the steps of (i) shaping a mixed powder of an indium oxide powder and an antimony oxide powder to obtain a shaped product, and (ii) sintering the shaped product: however, it discloses no $InSbO_4$-containing transparent electroconductive film.

SUMMARY OF THE INVENTION

An object of the present invention is to provide a process for producing an $InSbO_4$-containing transparent elcrtoconductive film having a high electroconductivity and a superior transparency.

Another object of the present invention is to provide a process for producing a transparent electroconductive film exhibiting little decrease in electroconductivity even when heat-treated at a high temperature.

The present inventors have found a problem that a film obtained by sputtering a target (A) for sputtering, which target contains In, Sb and O, and whose atomic ratio of Sb/In is from 0.9 to 1.1, contains a large amount of In dramatically departing from a stoichimetric ratio of $InSbO_4$, and as a result, a film having a high conductivity cannot be obtained.

The present inventors have undertaken extensive studies to solve such a problem, and as a result, have found that:

(1) there can be obtained an $InSbO_4$-containing transparent electroconductive film, whose atomic ratio of In and Sb is near to the stoichimetric ratio of $InSbO_4$ and which has a high electroconductivity, by sputtering simultaneously the above-mentioned target (A) for sputtering and a metal Sb-containing target (B) for sputtering, and (2) there can be obtained an $InSbO_4$-containing transparent electroconductive film, wherein Sn and/or Hf is doped, whose atomic ratio of In and Sb is near to the stoichimetric ratio of $InSbO_4$, and which has a high electroconductivity, (a) by sputtering simultaneously the target (A) for sputtering, the target (B) for sputtering and at least one target (C) for sputtering selected from the group consisting of Sn, $SnO_2$, Hf and $HfO_2$; or (b) by sputtering simultaneously a target (D) for sputtering, which contains In, Sb, O and at least one element selected from the group consisting of Sn and Hf, and whose atomic ratio of Sb/In is from 0.9 to 1.1, and the target (B) for sputtering. Thereby, the present invention has been obtained.

Further, the present inventors have found that:

(1) a transparent film, which has high electroconductivity, which exhibits little decrease in electroconductivity even when heat-treated at a high temperature, and which contains In, Sb and O in a specific proportion, can be obtained by sputtering simultaneously the target (A) for sputtering and the target (B) for sputtering, (2) a transparent film, which has high electroconductivity, which exhibits little decrease in electroconductivity even when heat-treated at a high temperature, and which contains In, Sb and O in a specific proportion, can be obtained by sputtering simultaneously the target (A) for sputtering, the target (B) for sputtering and the target (C) for sputtering, (3) a target for sputtering, which contains In, Sb and O, and which has a specific atomic ratio of Sb/In can accomplish the objects of the present invention, (4) a target for sputtering, which contains In, Sb, O and at least one element selected from the group consisting of Sn and Hf, and which has a specific atomic ratio of Sb/In can accomplish the objects of the present invention, (5) there can be obtained an $InSbO_4$-containing transparent electroconductive film by sputtering a target (E) for sputtering, which contains In, Sb and O, and which has a specific atomic ratio of Sb/In, (6) there can be obtained an $InSbO_4$-containing transparent electroconductive film by sputtering simultaneously the target (E) for sputtering and at least one target (C) for sputtering, and (7) there can be obtained an $InSbO_4$-containing transparent electroconductive film by sputtering a target (F) for sputtering, which contains In, Sb, O and at least one element selected from the group consisting Sn and Hf, and which has a specific atomic ratio of Sb/In.

Thereby, the present invention has been obtained.

The present invention provides:

(1) a process for producing an $InSbO_4$-containing transparent electroconductive film, which comprises the step of sputtering simultaneously:

(i) a target (A) for sputtering, which comprises In, Sb and O, and whose atomic ratio of Sb/In is from 0.9 to 1.1, and (ii) a target (B) for sputtering, which comprises Sb (the process being hereinafter referred to as "process-1"), (2) a process for producing an InSbO$_4$-containing transparent electroconductive film, which comprises the step of sputtering simultaneously:
(i) a target (A) for sputtering, which contains In, Sb and O, and whose atomic ratio of Sb/In is from 0.9 to 1.1,
(ii) a target (B) for sputtering, which contains Sb, and
(iii) at least one target (C) for sputtering selected from the group consisting of Sn, SnO$_2$, Hf and HfO$_2$ (the process being hereinafter referred to as "process-2"), (3) a process for producing an InSbO$_4$-containing transparent electroconductive film, which comprises the step of sputtering simultaneously:
(i) a target (D) for sputtering, which contains In, Sb, O and at least one element selected from the group consisting of Sn and Hf, and whose atomic ratio of Sb/In is from 0.9 to 1.1, and
(ii) a target (B) for sputtering, which contains Sb (the process being hereinafter referred to as "process-3"), (4) a transparent eletroconductive film, which contains In, Sb and O, and whose atomic ratio of Sb/In is from 0.8 to 1.5 (the film being hereinafter referred to as "transparent electroconductive film-1"), (5) a transparent electroconductive film, which contains In, Sb, O and at least one element selected from the group consisting of Sn and Hf, and whose atomic ratio of Sb/In is from 0.8 to 1.5 (the film being hereinafter referred to as "transparent conductive film-2"), (6) a target for sputtering, which contains In, Sb and O, and whose atomic ratio of Sb/In is from 1.2 to 2.0, (7) a target for sputtering, which contains In, Sb, O and at least one element selected from the group consisting of Sn and Hf, and whose atomic ratio of Sb/In is from 1.2 to 2.0, (8) a process for producing an InSbO$_4$-containing transparent electroconductive film, which comprises the step of sputtering a target (E) for sputtering, which contains In, Sb and O, and whose atomic ratio of Sb/In is from 1.2 to 2.0 (the process being hereinafter referred to as "process-4"), (9) a process for producing an InSbO$_4$-containing transparent electroconductive film, which comprises the step of sputtering simultaneously:
(i) a target (E) for sputtering, which contains In, Sb and O, and whose atomic ratio of Sb/In is from 1.2 to 2.0, and
(ii) at least one target (C) for sputtering selected from the group consisting of Sn, SnO$_2$, Hf and HfO$_2$ (the process being hereinafter referred to as "process-5"), and

(10) a process for producing an InSbO$_4$-containing transparent electroconductive film, which comprises the step of sputtering a target (F) for sputtering, which contains In, Sb, O and at least one element selected from the group consisting Sn and Hf, and whose atomic ratio of Sb/In is from 1.2 to 2.0 (the process being hereinafter referred to as "process-6").

DETAILED DESCRIPTION OF THE INVENTION

The "target for sputtering" and "electroconductive" are hereinafter referred to simply as "target" and "conductive", respectively.

Among the processes for producing the transparent conductive film in accordance with the present invention, the above-mentioned process-1 to process-3 are explained as follows.

In the present invention, an atomic ratio of Sb/In in the target (A) containing In, Sb and O, and that in the target (D) containing In, Sb, O and at least one element selected from the group consisting of Sn and Hf, are from 0.9 to 1.1, respectively. When the atomic ratio is less than 0.9 or exceeds 1.1, it may be difficult to obtain a transparent conductive film having a high conductivity. As the case may be, the transparent conductive film is hereinafter referred to simply as "film".

The target (A) used in the present invention means a target containing InSbO$_4$, or a target containing a mixture of an indium oxide and an antimony oxide, provided that an atomic ratio of Sb/In is from 0.9 to 1.1. Of these, the InSbO$_4$-containing target is preferred.

Similarly, the target (D) used in the present invention means a target containing InSbO$_4$, or a target containing a mixture of an indium oxide and an antimony oxide, provided that an atomic ratio of Sb/In is from 0.9 to 1.1. Of these, the InSbO$_4$-containing target is preferred.

In the present invention, a process using a combination of the target (D) and the target (B) containing metal Sb is more preferable than a process using a combination of the target (A) and the target (B), because a film having a higher conductivity can be obtained. Each of Sn and Hf in the target (D) is a dopant. From a viewpoint of obtaining a film having a high conductivity, an Sn content in the target (D), an Hf content in said target (D) or a total content of Sn and Hf in said target (D) is preferably not more than 0.2 in terms of atomic ratio, respectively, provided that the sum of Sn, Hf, In and Sb is 1.

It is possible to dope at least one element selected from the group consisting of Sn and Hf even by a process comprising the step of sputtering simultaneously the target (A), the target (B) and at least one target (C) selected from the group consisting of Sn, SnO$_2$, Hf and HfO$_2$. Said process is more preferable than a process using a combination of the target (A) and the target (B), because a film having a higher conductivity can be obtained. A total area of a sputtered face in the target (C) is preferably not more than 0.2, provided that a total area of a sputtered face in the target (A) is 1. When the area exceeds 0.2, a film having a higher conductivity may not be obtained. It is permitted to use a plurality of at least one kind of the target (C).

In the target (C), target (A) and target (D) used in the present invention, elements other than Ti, Zr, Si, Ge and Pb are impurities, provided that Sn, Hf, In, Sb and O are naturally exceptions. From a viewpoint of obtaining a film having a high conductivity, it is preferable to use these targets having a small content of the impurities, preferably not more than 1% by weight, provided that the weight of the target is 100% by weight. For the purposes of improving surface smoothness of a film obtained, improving density thereof, improving conductivity thereof and improving a sputtering speed, each of the above-mentioned targets may contain at least one oxide such as Ti oxides, Zr oxides, Si oxides, Ge oxides and Pb oxides.

The target (B) used in the present invention can be produced by shaping metal Sb into a plate such as a disc like plate or a square plate, which are preferable shapes for a target.

When the target (A) and the target (B) are not sputtered simultaneously, for example, when the step of sputtering the target (A) only and the step of sputtering the target (B) only are alternately repeated, it may be difficult to obtain a film having a high conductivity. Similarly, when the target (D) and the target (B) are used, or when the target (A), the target (B) and the target (C) are used, these targets are sputtered simultaneously.

In the present invention, a ratio of an area of a sputtered face in the target (A) to that of a sputtered face in the target (B), and a ratio of an area of a sputtered face in the target (D) to that of a sputtered face in the target (B) are preferably 1:0.001 to 0.1, respectively, from a viewpoint of obtaining a film having a high conductivity. When more than one target is used, the above-mentioned area means the sum of sputtered faces in respective targets.

The target (A) used in the present invention can be produced by a process comprising the steps of (i) molding a mixture of an indium oxide powder and an antimony oxide powder to obtain a molded product, and (ii) sintering the molded product. It is preferable to use a high purity indium oxide powder and a high purity antimony oxide powder, each of which has a content of impurities of not more than 1% by weight.

The target (D) used in the present invention can be produced by a process comprising the steps of (i) molding a mixture of an indium oxide powder, an antimony oxide powder and at least one powder selected from the group consisting of a tin oxide powder and a hafnium oxide powder to obtain a molded product, and (ii) sintering the molding product. It is preferable to use each high purity powder having a content of the impurities of not more than 1% by weight.

The indium oxide powder and the antimony oxide powder can be mixed with each other using a mixing machine usually industrially used such as a ball mill, vibrating mill, ATTRITOR (which is a trade name, and is manufactured by Mitsui Mining Co., Ltd.) and a V-type mixing machine. The powders can also be mixed with each other according to a wet mixing method with use of the above-mentioned mixing machine. In case of the wet mixing, the resulting powder mixture can be dried according to a drying method such as a heat drying method, a vacuum drying method and a freeze drying method.

The dried powder mixture may be (1) molded to obtain a molded product, (2) sintered to obtain a sintered product according to a method such as a hot pressing method and a hot isostatic pressing method, or (3) calcined at 600 to 1200° C. to obtain a calcined product (such a "calcination" being hereinafter referred to as "pre-calcination"), followed by pulverization of the pre-calcined product to obtain an $InSbO_4$-containing pre-calcined powder, and further followed by molding or sintering of the pre-calcined powder. Of these, the above method (3) is preferable.

The dried powder mixture may be molded by a method usually industrially used such as a uniaxial pressing method and a isotactic pressing method to obtain a molded product. A molding pressure is usually within a range of from 10 to 300 MPa. A shape of the molded product is a disk like plate or a square plate, which are preferable shapes for a target. A density of the molded product is usually from 35 to 65% of a theoretical density.

The sintering can be carried out using a furnace usually industrially used such as an electric furnace or a gas furnace in an oxygen-containing atmosphere such as air under atmospheric pressure at a temperature of from 900 to 1700° C. By sintering, a sintered product, which can be used as a target, can be obtained. The sintered product can be cut or ground to obtain a product having a desired size. The desired size may be obtained by cutting or grinding the molded product, which can be cut or ground more easily than the sintered product.

Among the target (C), (1) a target comprising at least one oxide selected from the group consisting of $SnO_2$ and $HfO_2$ can be produced by a process similar to the above-mentioned one, (2) a target comprising at least one metal selected from the group consisting of Sn and Hf can be produced by shaping the metal into a form such as a disk like plate or a square plate, which are preferable shapes for a target, and (3) a target comprising at least one oxide selected from the group consisting of $SnO_2$ and $HfO_2$ and at least one metal selected from the group consisting of Sn and Hf can be produced by a process comprising the steps of (i) preparing a porous sintered product containing said oxide, and (ii) impregnating the porous sintered product with said molten metal.

From a viewpoint of obtaining a film having a high conductivity, the $InSbO_4$-containing transparent conductive film obtained according to the process-1 to process-3 in accordance with the present invention may contain oxides such as $Sb_2O_4$, $Sb_2O_5$, $Sb_2O_3$ and $In_2O_3$, as far as the atomic ratio of Sb/In is within a range of from 0.8 to 1.5.

From a viewpoint of obtaining the film having a high conductivity, it is preferable to calcine the $InSbO_4$-containing transparent conductive film obtained according to the abovementioned processes at a temperature ranging from 500 to 1100° C. The atomic ratio of Sb/In in the film after calcining is also within a range of from 0.8 to 1.5.

"$InSbO_4$" in the $InSbO_4$-containing transparent conductive film obtained according to the process-1 to process-3 in accordance with the present invention means a single phase complex oxide containing In, Sb and O. The atomic ratio of Sb/In in the film is preferably from 0.8 to 1.5.

The transparent conductive film-1 and film-2 in accordance with the present invention are explained as follows.

The transparent conductive film in accordance with the present invention contains In, Sb and O, and $InSbO_4$ contained in the film means a single phase complex oxide. The transparent conductive film in accordance with the present invention may contain oxides such as $Sb_2O_3$, $Sb_2O_4$, $Sb_2O_5$, and $In_2O_3$ in addition to $InSbO_4$.

From a viewpoint of obtaining the film having a high conductivity, the atomic ratio of Sb/In in the film in accordance with the present invention is from 0.8 to 1.5.

Further, the transparent conductive film in accordance with the present invention contains In, Sb, O, and at least one element selected from the group consisting of Sn and Hf. Said film has a higher conductivity than that of the In, Sb and O-containing film. An Sn content or an Hf content or a total content of Sn and Hf is preferably not more than 0.2 in terms of an atomic ratio, provided that the sum of Sn, Hf, In and Sb is 1. When the content exceeds 0.2, the film having a high conductivity may not be obtained.

In the transparent conductive film in accordance with the present invention, elements other than Ti, Zr, Si, Ge and Pb are impurities, provided that Sn, Hf, In, Sb and O are naturally exceptions. A total content of the impurities in the film is preferably not more than 1% by weight, from a viewpoint of obtaining a transparent conductive film having a high conductivity. The transparent conductive film in accordance with the present invention may contain elements such as Ti, Zr, Si, Ge and Pb in each amount of usually not more than 1000 ppm by weight for the purposes of improving surface smoothness of the film obtained, improving density thereof, improving conductivity thereof and improving a sputtering speed.

Among the processes for producing the transparent conductive film in accordance with the present invention, the process-4, process-5 and process-6 are explained as follows.

The atomic ratio of Sb/In in the target (E) containing In, Sb and O, and the atomic ratio of Sb/In in the target (F) containing In, Sb, O and at least one element selected from the group consisting of Sn and Hf, both of which targets are used in the present invention, are from 1.2 to 2.0, preferably from 1.3 to 1.8, and more preferably from 1.4 to 1.7.

Each composition of the target (E) and the target (F) may be (1) $InSbO_4$, (2) a mixture of an indium oxide such as $In_2O_3$ and an antimony oxide such as $Sb_2O_3$, $Sb_2O_4$ or $Sb_2O_5$, or (3) a mixture of $InSbO_4$ and at least one oxide selected from the group consisting of indium oxides and antimony oxides. Of these, preferred are those containing $InSbO_4$ such as the embodiments (1) and (3).

From a viewpoint of obtaining a film having a high conductivity, it is preferable to use the target (F) rather than the target (E). Each of the elements, Sn and Hf, in the target (F) is a dopant, namely, a solid solution substance present in $InSbO_4$ without changing the crystal structure of $InSbO_4$. From a viewpoint of obtaining a film having a high conductivity, an Sn content or an Hf content or a total content of Sn and Hf is preferably not more than 0.2 in terms of an atomic ratio, provided that the sum of Sn, Hf, In and Sb is 1.

In the above-mentioned process-5, wherein the target (E) and the target (C) are sputtered simultaneously, a total area of a sputtered face in the target (C) is preferably not more than 0.2, provided that a total area of a sputtered face in the target (E) is 1, from a viewpoint of obtaining a film having a high conductivity. It is permitted to use a plurality of at least one kind of the target (C).

In the target (C), target (E) and target (F) used in the present invention, elements other than Ti, Zr, Si, Ge and Pb are impurities, provided that Sn, Hf, In, Sb and O are naturally exceptions. From a viewpoint of obtaining a film having a high conductivity, a content of the impurities in each of these targets is preferably not more than 1% by weight, provided that a weight of the target is 100% by weight. Each of these targets may contain at least one oxide such as Ti oxides, Zr oxides, Si oxides, Ge oxides and Pb oxides in an amount of usually not more than 1000 ppm by weight in terms of the element contained in each of said oxides, for the purposes of improving surface smoothness of the film obtained, improving density thereof, improving conductivity thereof and improving a sputtering speed.

The target (E) used in the present invention can be produced by a process comprising the steps of (i) shaping a mixture of an indium oxide powder and an antimony oxide powder to obtain a shaped product, and (ii) sintering the shaped product. It is preferable to use each of the indium oxide powder and the antimony oxide powder, which has a content of impurities of not more than 1% by weight.

The target (F) used in the present invention can be produced by a process comprising the steps of (i) shaping a mixture of an indium oxide powder, an antimony oxide powder and at least one powder selected from the group consisting of a tin oxide powder and a hafnium oxide powder, to obtain a shaped product, and (ii) sintering the shaped product. It is preferable to use each of the indium oxide powder, the antimony oxide powder, the tin oxide powder and the hafnium oxide powder, which has a content of impurities of not more than 1% by weight.

The above-mentioned powders can be mixed with one another using a mixing machine usually industrially used such as a ball mill, a vibrating mill, ATTRITOR (which is a trade name, and is manufactured by Mitsui Mining Co., Ltd.) and a V-type mixing machine. The powders can also be mixed with each other according to a wet mixing method with use of the above-mentioned mixing machine. In case of the wet mixing, the resulting powder mixture can be dried according to a drying method such as a heat drying method, a vacuum drying method and a freeze drying method.

The dried powder mixture may be (1) molded to obtain a molded product, (2) sintered to obtain a sintered product according to a method such as a hot pressing method and a hot isostatic pressing method, or (3) calcined at 600 to 1200° C. to obtain a calcined product (such a "calcination" being hereinafter referred to as "pre-calcination"), followed by pulverization of the pre-calcined product to obtain an $InSbO_4$-containing pre-calcined powder, and further followed by molding or sintering of the pre-calcined powder. Of these, the above method (3) is preferable.

The dried powder mixture may be molded by a method usually industrially used such as a uniaxial pressing method and a isotactic pressing method to obtain a molded product. A molding pressure is usually within a range of from 10 to 300 MPa. A shape of the molded product is a disk like plate or a square plate, which are preferable shapes for a target. A density of the molded product is usually from 35 to 65% of a theoretical density.

The sintering can be carried out using a furnace usually industrially used such as an electric furnace or a gas furnace in an oxygen-containing atmosphere such as air under atmospheric pressure at a temperature of from 900 to 1700° C. By sintering, a sintered product, which can be used as a target, can be obtained. The sintered product can be cut or ground to obtain a product having a desired size. The desired size may be obtained by cutting or grinding the molded product, which can be cut or ground more easily than the sintered product.

Among the target (C), (1) a target comprising at least one oxide selected from the group consisting of $SnO_2$ and $HfO_2$ can be produced by a process similar to the above-mentioned one, (2) a target comprising at least one metal selected from the group consisting of Sn and Hf can be produced by shaping the metal into a form such as a disk like plate or a square plate, which are preferable shapes for a target, and (3) a target comprising at least one oxide selected from the group consisting of $SnO_2$ and $HfO_2$ and at least one metal selected from the group consisting of Sn and Hf can be produced by a process comprising the steps of (i) preparing a porous sintered product containing said oxide, and (ii) impregnating the porous sintered product with said molten metal.

From a viewpoint of obtaining a film having a high conductivity, the $InSbO_4$-containing transparent conductive film obtained according to the process-4 to process-6 in accordance with the present invention may contain oxides such as $Sb_2O_4$, $Sb_2O_5$, $Sb_2O_3$ and $In_2O_3$, as far as the atomic ratio of Sb/In is within a range of from 0.8 to 1.5.

From a viewpoint of obtaining the film having a high conductivity, it is preferable to calcine the $InSbO_4$-containing transparent conductive film obtained according to the above-mentioned processes at an ultimate maximum temperature ranging from 500 to 1100° C. When the ultimate maximum temperature is out of the range, the conductivity may not be improved by the calcination. The atomic ratio of Sb/In in the film after calcning is also within a range of from 0.8 to 1.5.

The transparent conductive films in accordance with the present invention, and those obtained according to the processes in accordance with the present invention have a high conductivity, and can be used for applications such as electrodes for inorganic EL panels, liquid crystal displays and solar batteries; hot wave reflection films for window glass; and antistatic films. Particularly, the transparent conductive films exhibiting little decrease in conductivity when heat-treated at a high temperature are suitable for the inorganic EL panels.

Further, the transparent conductive films in accordance with the present invention and those obtained according to the processes in accordance with the present invention have a lower content of expensive indium than the film comprising the ITO, and therefore, the former films are cheaper than the latter film.

Still further, the transparent conductive films in accordance with the present invention and those obtained according to the processes in accordance with the present invention have little absorption of light ranging from visible rays having short wave lengths to ultraviolet rays. Therefore, their transmittance of visible rays is so high that their transparency is satisfactory.

EXAMPLE

Examples of the present invention are given as follows, but the present invention is not limited thereto.

Example 1

An indium oxide powder ($In_2O_3$ powder) having a purity of 99.99%, manufactured by Kojundo Chemical Laboratory Co., Ltd. and an antimony oxide powder ($Sb_2O_3$ powder) having a high purity ceramics grade manufactured by Junsei Chemical Co., Ltd. were weighed so as to make an atomic ratio of Sb/In=1. Both powders were mixed in the presence of ethanol according to a wet ball milling method with use of zirconia balls having a diameter of 5 mm to obtain a slurry.

The slurry was heated to remove ethanol, and the residue was pre-calcined in air atmosphere at 700° C. for 5 hours in an alumina crucible to obtain a pre-calcined powder. The pre-calcined powder was found to be a mixture of $Sb_2O_4$ (JCPDS Card No. 110694), $In_2O_3$ (JCPDS Card No. 60416) and $InSbO_4$ (JCPDS Card No. 150522) according to an X-ray diffraction method.

The pre-calcined powder was pulverized in the presence of ethanol according to a wet ball milling method with use of zirconia balls having a diameter of 2 mm to obtain a slurry.

The slurry was heated to remove ethanol, and the residue was again dispersed in ethanol. Polyvinylbutyral, a trade name of S-LEC B, manufactured by Sekisui Chemical Co. Ltd., as a binder was added thereto, and the mixture was stirred and thereafter dried to obtain a powder.

The powder was shaped into a disc like form under pressure of 100 MPa in a mold using an uniaxial press, and the shaped product was further shaped under pressure of 150 MPa using a CIP (Cold Isostatic Press) to obtain a disc like product.

The disc like product was sintered in an air atmosphere under an atmospheric pressure at 1000° C. for 5 hours to obtain a sintered product. The sintered product (target) was found to be a mixture of $Sb_2O_4$, $In_2O_3$ and $InSbO_4$ according to an X-ray diffraction method.

Both targets of the sintered product and a disc of metal antimony were set in a chamber of a sputtering apparatus, a trade name of Type L-332H, manufactured by ANELVA Co., and a silicon substrate, on which a film is to be deposited, was set in the sputtering apparatus. An area ratio of an area of a sputtered face in the disc of metal antimony to that of a sputtered face in the sintered product was found to be 0.0044. Ar gas was introduced in the sputtering apparatus, and sputtering was carried out under conditions of pressure of 1 Pa, electric power of 50 W and a substrate temperature of 400° C. to obtain a substrate deposited with a film.

The substrate was calcined at 900° C. to obtain a conductive film, which was visually transparent. An atomic ratio of Sb/In in the obtained transparent conductive film was found to be 0.92, and resistivity of the film was found to be $6\times10^{-3}$ $\Omega$cm.

Example 2

The sintered product obtained in Example 1, the same disk of metal antimony as that in Example 1 and a disk of $SnO_2$, which were targets, and a silicon substrate as a substrate on which a film is to be deposited were set in the sputtering apparatus used in Example 1.

Sputtering was carried out under the same conditions as those in Example 1, and the resulting film was calcined at 700° C. to obtain a conductive film, which was visually transparent. A doping amount of Sn in the obtained transparent conductive film was found to be 4.5 atomic %, and resistivity of the film was found to be $9\times10^{-3}$ $\Omega$cm.

Example 3

The sintered product obtained in Example 1, the same disk of metal antimony as that in Example 1 and a disk of $HfO_2$, which were targets, and a silicon substrate as a substrate on which a film is to be deposited were set in the sputtering apparatus used in Example 1.

Sputtering was carried out under the same conditions as those in Example 1, and the resulting film was calcined at 700° C. to obtain a conductive film, which was visually transparent. A doping amount of Hf in the obtained transparent conductive film was found to be 2.4 atomic %, and resistivity of the film was found to be $5\times10^{-3}$ $\Omega$cm.

Comparative Example 1

The sintered product obtained in Example 1 only as a target and a silicon substrate as a substrate on which a film is to be deposited were set in the sputtering apparatus used in Example 1.

Sputtering was carried out under the same conditions as those in Example 1, and the resulting film was calcined at 700° C. to obtain a conductive film, which was visually transparent. An atomic ratio of Sb/In in the obtained transparent conductive film was found to be 0.67, and resistivity of the film was found to be as high as $1\times10^{-1}$ $\Omega$cm.

Example 4

An indium oxide powder ($In_2O_3$ powder) having a purity of 99.99%, manufactured by Kojundo Chemical Laboratory Co., Ltd. and an antimony oxide powder ($Sb_2O_3$ powder) having a high purity ceramics grade manufactured by Junsei Chemical Co., Ltd were weighed so as to make an atomic ratio of Sb/In=1.5. Both powders were mixed in the presence of ethanol according to a wet ball milling method with use of zirconia balls having a diameter of 5 mm to obtain a slurry.

The slurry was heated to remove ethanol, and the residue was pre-calcined in air atmosphere at 700° C. for 5 hours in an alumina crucible to obtain a pre-calcined powder. The pre-calcined powder was found to be a mixture of $Sb_2O_4$ (JCPDS Card No. 110694), $In_2O_3$ (JCPDS Card No. 60416) and $InSbO_4$ (JCPDS Card No. 150522) according to an X-ray diffraction method.

The pre-calcined powder was pulverized in the presence of ethanol according to a wet ball milling method with use of zirconia balls having a diameter of 2 mm to obtain a slurry.

The slurry was heated to remove ethanol, and the residue was again dispersed in ethanol. Polyvinylbutyral, a trade name of S-LEC B, manufactured by Sekisui Chemical Co. Ltd., as a binder was added thereto, and the mixture was stirred and thereafter dried to obtain a powder.

The powder was shaped into a disc like form under pressure of 100 MPa in a mold using an uniaxial press, and the shaped product was further shaped under pressure of 150 MPa using a CIP (Cold Isostatic Press) to obtain a disc like product.

The disc like product was sintered in an air atmosphere under an atmospheric pressure at 1000° C. for 5 hours to obtain a sintered product. The sintered product (target) was found to be a mixture of $Sb_2O_4$, $In_2O_3$ and $InSbO_4$ according to an X-ray diffraction method.

Both the sintered product as a target and a silicon substrate on which a film is to be deposited were set in the sputtering apparatus used in Example 1. A mixed gas of 60% by volume of oxygen and 40% by volume of argon was introduced in the sputtering apparatus. Sputtering was carried out under conditions of pressure of 1 Pa, electric power of 50 W and a substrate temperature of 400° C., and thereafter, the film deposited on the substrate was calcined at 900° C. to obtain a conductive film, which was visually transparent. An atomic ratio of Sb/In in the obtained transparent conductive film was found to be 1.13, and resistivity of the film was found to be $7\times10^{-3}$ $\Omega$cm.

The substrate on which the film was deposited was heat-treated at 700° C., 900° C., 1000° C. and 1100° C., respectively. Respective films obtained were visually transparent, and their resistivity was found to be $2\times10^{-2}$ $\Omega$cm, $7\times10^{-3}$ $\Omega$cm, $9\times10^{-3}$ $\Omega$cm and $1\times10^{-2}$ $\Omega$cm, respectively.

Example 5

The sintered product obtained in Example 4 and a disk of $SnO_2$, both of which were targets, and a silicon substrate as a substrate on which a film is to be deposited were set in the sputtering apparatus used in Example 1.

Sputtering was carried out under the same conditions as those in Example 4 to obtain a conductive film, which was visually transparent. A doping amount of Sn in the obtained transparent conductive film was found to be 7.0 atomic %, and resistivity of the film was found to be $9\times10^{-3}$ $\Omega$cm.

Example 6

The sintered product obtained in Example 4 and a disk of $HfO_2$, both of which were targets, and a silicon substrate as a substrate on which a film is to be deposited were set in the sputtering apparatus used in Example 1.

Sputtering was carried out under the same conditions as those in Example 4, and the resulting film was calcined at 900° C. to obtain a conductive film, which was visually transparent. A doping amount of Hf in the obtained transparent conductive film was found to be 3.0 atomic %, and resistivity of the film was found to be $1\times10^{-2}$ $\Omega$cm.

The invention claimed is:

1. A target for sputtering, which contains In, Sb and O, and whose atomic ratio of Sb/In is from 1.5 to 2.0.

2. A target for sputtering, which contains In, Sb, O and at least one element selected from the group consisting of Sn and Hf, and whose atomic ratio of Sb/In is from 1.5 to 2.0.

3. A process for producing an $InSbO_4$-containing transparent electroconductive film, which comprises the step of sputtering a target (E) for sputtering, which contains In, Sb and O, and whose atomic ratio of Sb/In is from 1.5 to 2.0.

4. The process for producing an $InSbO_4$-containing transparent electroconductive film according to claim 3, which further comprises the step of calcining at an ultimate maximum temperature ranging from 500° C. to 1100° C. after the step of sputtering.

5. A process for producing an $InSbO_4$-containing transparent electroconductive film, which comprises the step of sputtering simultaneously:
   (i) a target (B) for sputtering, which contains In, Sb and O, and whose atomic ratio of Sb/In is from 1.5 to 2.0, and
   (ii) at least one target (C) for sputtering selected from the group consisting of Sn, $SnO_2$, Hf and $HfO_2$.

6. The process for producing an $InSbO_4$-containing transparent electroconductive film according to claim 5, which further comprises the step of calcining at an ultimate maximum temperature ranging from 500° C. to 1100° C. after the step of sputtering.

7. A process for producing an $InSbO_4$-containing transparent electroconductive film, which comprises the step of sputtering a target (F) for sputtering, which contains In, Sb, O and at least one element selected from the group consisting Sn and Hf, and whose atomic ratio of Sb/In is from 1.5 to 2.0.

8. The process for producing an $InSbO_4$-containing transparent electroconductive film according to claim 7, which further comprises the step of calcining at an ultimate maximum temperature ranging from 500° C. to 1100° C. after the step of sputtering.

* * * * *